(12) United States Patent
Chow et al.

(10) Patent No.: US 9,293,350 B2
(45) Date of Patent: Mar. 22, 2016

(54) SEMICONDUCTOR PACKAGE SYSTEM WITH CAVITY SUBSTRATE AND MANUFACTURING METHOD THEREFOR

(75) Inventors: Seng Guan Chow, Singapore (SG); Rui Huang, Singapore (SG); Heap Hoe Kuan, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 712 days.

(21) Appl. No.: 12/260,089

(22) Filed: Oct. 28, 2008

(65) Prior Publication Data

US 2010/0102458 A1    Apr. 29, 2010

(51) Int. Cl.
*H01L 23/49* (2006.01)
*H01L 21/56* (2006.01)
*H01L 23/31* (2006.01)
*H01L 23/00* (2006.01)
(Continued)

(52) U.S. Cl.
CPC .......... *H01L 21/565* (2013.01); *H01L 23/3128* (2013.01); *H01L 24/16* (2013.01); *H01L 24/49* (2013.01); *H01L 24/97* (2013.01); *H01L 25/03* (2013.01); *H01L 25/50* (2013.01); *H01L 24/29* (2013.01); *H01L 24/48* (2013.01); *H01L 25/0655* (2013.01); *H01L 25/0657* (2013.01); *H01L 2224/13099* (2013.01); *H01L 2224/16225* (2013.01); *H01L 2224/16237* (2013.01); *H01L 2224/32145* (2013.01); *H01L 2224/4824* (2013.01); *H01L 2224/48091* (2013.01); *H01L 2224/48145* (2013.01); *H01L 2224/48157* (2013.01); *H01L 2224/48225* (2013.01); *H01L 2224/48227* (2013.01); *H01L 2224/48228* (2013.01); *H01L 2224/48237* (2013.01); *H01L 2224/48465* (2013.01); *H01L 2224/4903* (2013.01); *H01L 2224/4911* (2013.01); *H01L 2224/49051* (2013.01); *H01L 2224/73265* (2013.01); *H01L 2224/97* (2013.01); *H01L 2225/06558* (2013.01); *H01L 2924/00014* (2013.01); *H01L 2924/014* (2013.01); *H01L 2924/01014* (2013.01); *H01L 2924/01031* (2013.01); *H01L 2924/078* (2013.01); *H01L 2924/10253* (2013.01); *H01L 2924/14* (2013.01); *H01L 2924/1517* (2013.01); *H01L 2924/15153* (2013.01); *H01L 2924/15311* (2013.01); *H01L 2924/19103* (2013.01); *H01L 2924/19105* (2013.01); *H01L 2924/19107* (2013.01)

(58) Field of Classification Search
CPC ................. H01L 2224/97; H01L 2224/92247; H01L 2924/15153; H01L 2924/19107; H01L 23/3121; H01L 23/49838; H01L 23/3107; H01L 2225/06555; H01L 25/162; H01L 23/3675; H01L 25/0657; H01L 2224/85; H01L 24/97; H01L 2225/0651; H01L 24/85; H01L 21/565; H01L 24/49; H01L 23/3128; H01L 25/03
USPC .................................. 257/777, 778, 690, 698
See application file for complete search history.

(56) References Cited

U.S. PATENT DOCUMENTS 6,228,682 B1    5/2001  Farooq et al.
6,333,856 B1 *  12/2001 Harju ............................ 361/761
(Continued)

*Primary Examiner* — Julio J Maldonado
*Assistant Examiner* — Sarah Salerno
(74) *Attorney, Agent, or Firm* — Ishimaru & Associates LLP

(57) ABSTRACT

A method of manufacturing a semiconductor package system includes: providing a first substrate; providing a second substrate having a cavity, the second substrate being attached to the first substrate; connecting the first substrate to the second substrate using an interconnect, the interconnect being in the cavity; and attaching a semiconductor device to the first substrate or the second substrate.

20 Claims, 6 Drawing Sheets

(51) Int. Cl.
  *H01L 25/03*  (2006.01)
  *H01L 25/00*  (2006.01)
  *H01L 25/065*  (2006.01)

(56) References Cited

U.S. PATENT DOCUMENTS

| | | | |
|---|---|---|---|
| 6,338,985 B1 * | 1/2002 | Greenwood | 438/126 |
| 6,384,473 B1 | 5/2002 | Peterson et al. | |
| 6,396,116 B1 * | 5/2002 | Kelly et al. | 257/432 |
| 6,472,761 B2 * | 10/2002 | Nakamura | 257/778 |
| 6,501,164 B1 * | 12/2002 | Chen et al. | 257/686 |
| 6,511,866 B1 | 1/2003 | Bregante et al. | |
| 6,521,984 B2 * | 2/2003 | Matsuura | 257/678 |
| 6,833,628 B2 * | 12/2004 | Brandenburg et al. | 257/778 |
| 7,026,709 B2 | 4/2006 | Tsai et al. | |
| 7,196,407 B2 | 3/2007 | Takahashi | |
| 7,205,646 B2 | 4/2007 | Lin et al. | |
| 7,205,647 B2 | 4/2007 | Karnezos | |
| 7,355,274 B2 | 4/2008 | Lim | |
| 7,420,814 B2 | 9/2008 | Kim et al. | |
| 2002/0096781 A1 * | 7/2002 | Toyosawa | 257/777 |
| 2004/0150099 A1 * | 8/2004 | Ding et al. | 257/712 |
| 2004/0201109 A1 * | 10/2004 | Yamaguchi | 257/777 |
| 2007/0087079 A1 | 4/2007 | Murugan | |
| 2007/0273023 A1 | 11/2007 | Zhao et al. | |
| 2008/0142254 A1 * | 6/2008 | Wang et al. | 174/259 |
| 2008/0185719 A1 * | 8/2008 | Cablao et al. | 257/738 |
| 2009/0152740 A1 | 6/2009 | Park et al. | |
| 2010/0148344 A1 * | 6/2010 | Chandra et al. | 257/690 |

* cited by examiner

US 9,293,350 B2

SEMICONDUCTOR PACKAGE SYSTEM WITH CAVITY SUBSTRATE AND MANUFACTURING METHOD THEREFOR

TECHNICAL FIELD

The present invention relates generally to semiconductor packages, and more particularly to a system for a semiconductor package for a smaller, thinner, and denser solution.

BACKGROUND ART

In the electronics industry, the tendency has been to reduce the size of electronic devices such as camcorders and portable telephones while increasing performance and speed. Integrated circuit packages for complex systems typically are comprised of multiple interconnected integrated circuit chips. The integrated circuit chips usually are made from a semiconductor material such as silicon or gallium arsenide. The integrated circuit chips may be mounted in packages that are then mounted on printed wiring boards.

Typically, the packages on which these integrated semiconductor chips are mounted include a substrate or other chip-mounting device. Substrates are parts that provide the package with mechanical base support and a form of electrical interface that would allow the external world to access the device housed within the package. When multiple chips are mounted within the same semiconductor package, routing problems may arise due to the different routing design of each individual chip. To solve this problem, an interposer is often used. An interposer is an electrical interface routing between one socket or connection to another. It is an intermediate layer often used for interconnection routing or as a ground/power plane. Sometimes the terms 'substrate' and 'interposer' are used to refer to the same thing.

A 3D integrated circuit (3D IC) is a single integrated circuit built by stacking silicon wafers and/or dies and interconnecting them vertically so that they behave as a single device. A 3D package contains two or more chips (integrated circuits) stacked vertically so that they occupy less horizontal space. Each such chip in such a 3D package could be a conventional chip, a flip chip, or other types of chips.

Conventionally, a single logic die is mounted on silicon substrate. However, if additional functionality such as flash memory is required to be added to the package stack, 3D IC is needed. A Package-on-Package (PoP) package is a 3D package in which fully tested packages are stacked on top of one another during the board mount process. A PoP package usually consists of a bottom package and a top package. A Fan-in PoP (Fi-PoP) package is a 3D package that allows the top package and the bottom package to be of different sizes so as to broaden the types of chips that could be integrated together in one single package.

The typical way of stacking multiple chips is to place each chip vertically on top of each other. Each individual chip is mounted on its own substrate and the chip-substrate units are stacked vertically, one on top of another.

When the number of chips to be so stacked is small, the thickness of the final package is still acceptable. However, the modern trend of the semiconductor industry is that more and more chips need to be stacked in a limited space, horizontally as well as vertically. If the number of chips to be stacked vertically is large, the thickness of the final package becomes unacceptable.

Furthermore, sometimes passive devices need to be integrated into the semiconductor package. Usually these devices are attached to the main substrate of the package and the devices occupy a part of the main substrate area, resulting in reduced space available for the active chips.

Thus, a need still remains for accommodating the modern trend of 3D interconnection design in semiconductor packaging, reducing the package footprint and thickness and increasing the packaging density. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacturing a semiconductor package system including: providing a first substrate; providing a second substrate having a cavity, the second substrate being attached to the first substrate; connecting the first substrate to the second substrate using an interconnect, the interconnect being in the cavity; and attaching a semiconductor device to the first substrate or the second substrate.

The present invention provides a semiconductor package system including: a first substrate; a second substrate having a cavity, the second substrate being attached to the first substrate and being connected to the first substrate through an interconnect, the interconnect being in the cavity; and a semiconductor device attached to the first substrate or the second substrate.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
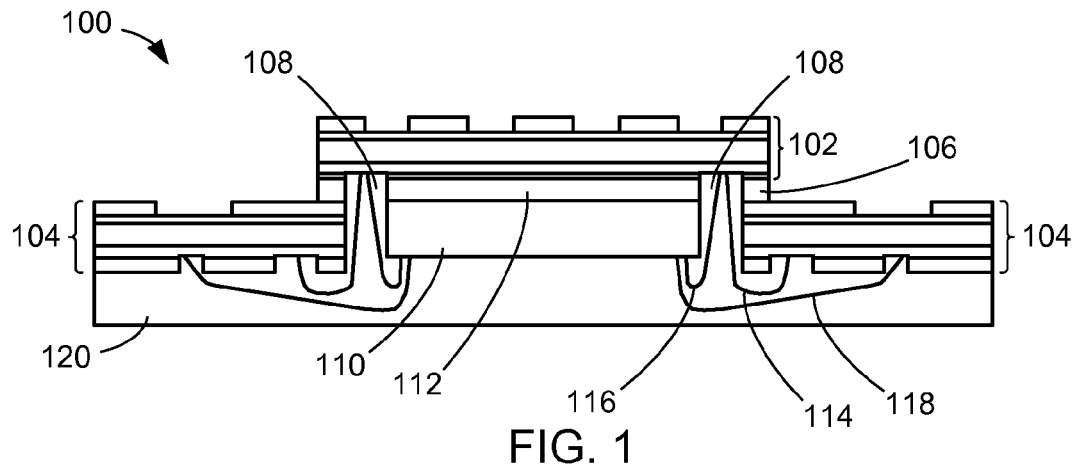
FIG. 1 is a cross-sectional view of a semiconductor package system after a stage of singulation.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. Likewise, the drawings showing embodiments of the system are semi-diagrammatic and not to scale and, particularly, some of the dimensions are for the clarity of presentation and are shown exaggerated in the drawings. Also, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the semiconductor substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "substrate" as used herein refers to a laminate of more than one layer (multilayer substrate) having internal vias to connect electrical pads and tracings on top and/or bottom.

Referring now to FIG. 1, therein is shown a cross-sectional view of a semiconductor package system after a stage of singulation. A semiconductor package 100 is shown.

The semiconductor package 100 has a first substrate 102 and a second substrate 104. The first substrate 102 is attached to the second substrate 104 through a substrate adhesive 106. The second substrate 104 has a cavity 108. The cavity 108 is coplanar with the second substrate 104. A semiconductor die 110 is attached to the first substrate 102 through a die paste 112. The semiconductor die 110 lies in the cavity 108.

A substrate bonding wire 114 in and extending out the cavity 108 is directly attached or connected to the first substrate 102 and to the second substrate 104. A first type bonding wire 116 connects the semiconductor die 110 to the first substrate 102. A second type bonding wire 118 connects the semiconductor die 110 to the second substrate 104.

The semiconductor die 110, the die paste 112, the cavity 108, the second substrate 104, the substrate bonding wire 114, the first type bonding wire 116, and the second type bonding wire 118 are encapsulated by a mold 120. The substrate bonding wire 114 is referred to as an interconnect. The second substrate 104 has a peripheral edge which is coplanar with a peripheral edge of the mold 120.

In the current embodiment of the present invention, the first substrate 102, the semiconductor die 110, and the second substrate 104 are not on top of one another. However, due to the existence of the cavity 108, the semiconductor die 110 and the second substrate 104 are horizontal to each other, instead of vertical to each other. It has been discovered that this configuration reduces the thickness of the semiconductor package 100, resulting in increased packaging density.

Figure 2:
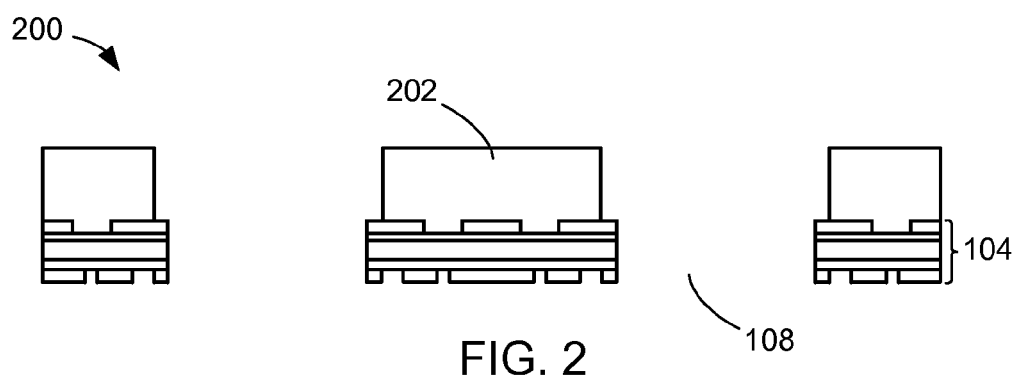
FIG. 2 is a cross-sectional view similar to FIG. 1 of an unfinished semiconductor package of the first embodiment of the present invention after a first intermediate stage of the process.

Referring now to FIG. 2, therein is shown a cross-sectional view similar to FIG. 1 of an unfinished semiconductor package 200 of the first embodiment of the present invention after a first intermediate stage of the process.

The second substrate 104 having the cavity 108 is shown. A protection layer 202 is attached to the second substrate 104.

Figure 3:
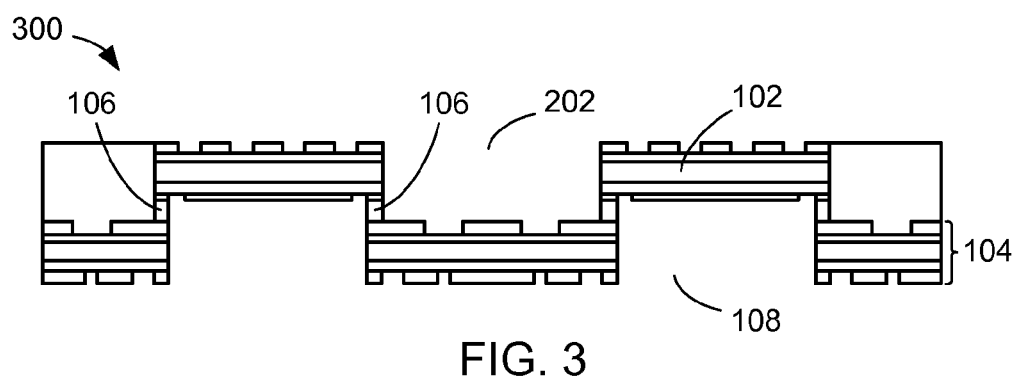
FIG. 3 is a cross-sectional view similar to FIG. 1 of an unfinished semiconductor package of the first embodiment of the present invention after a second intermediate stage of the process.

Referring now to FIG. 3, therein is shown a cross-sectional view similar to FIG. 1 of an unfinished semiconductor package 300 of the first embodiment of the present invention after a second intermediate stage of the process.

The first substrate 102 is attached to the second substrate 104 through the substrate adhesive 106.

Figure 4:
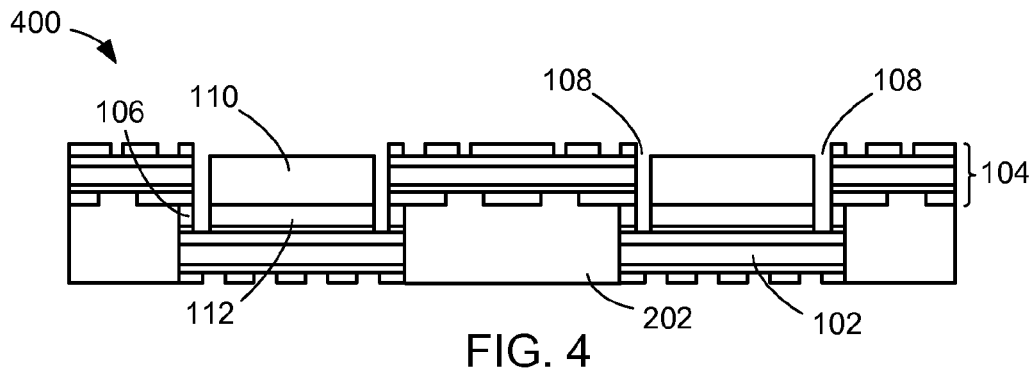
FIG. 4 is a cross-sectional view similar to FIG. 1 of an unfinished semiconductor package of the first embodiment of the present invention after a third intermediate stage of the process.

Referring now to FIG. 4, therein is shown a cross-sectional view similar to FIG. 1 of an unfinished semiconductor package 400 of the first embodiment of the present invention after a third intermediate stage of the process. The view of FIG. 4 is inverted from the view of FIG. 3.

The semiconductor die 110 is attached to the first substrate 102 through the die paste 112. The semiconductor die 110 is in the cavity 108 and is horizontal to the second substrate 104.

Figure 5:
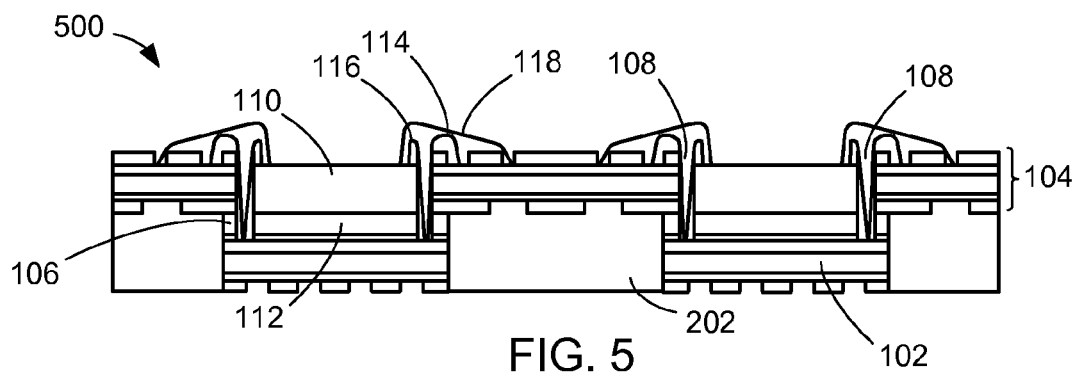
FIG. 5 is a cross-sectional view similar to FIG. 1 of an unfinished semiconductor package of the first embodiment of the present invention after a fourth intermediate stage of the process.

Referring now to FIG. 5, therein is shown a cross-sectional view similar to FIG. 1 of an unfinished semiconductor package 500 of the first embodiment of the present invention after a fourth intermediate stage of the process.

The substrate bonding wire 114 now connects the first substrate 102 to the second substrate 104. The first type bonding wire 116 connects the semiconductor die 110 to the first substrate 102. The second type bonding wire 118 connects the semiconductor die 110 to the second substrate 104.

The purpose of the presence of the protection layer 202 is to serve as a support layer for the wire bonding process.

Figure 6:
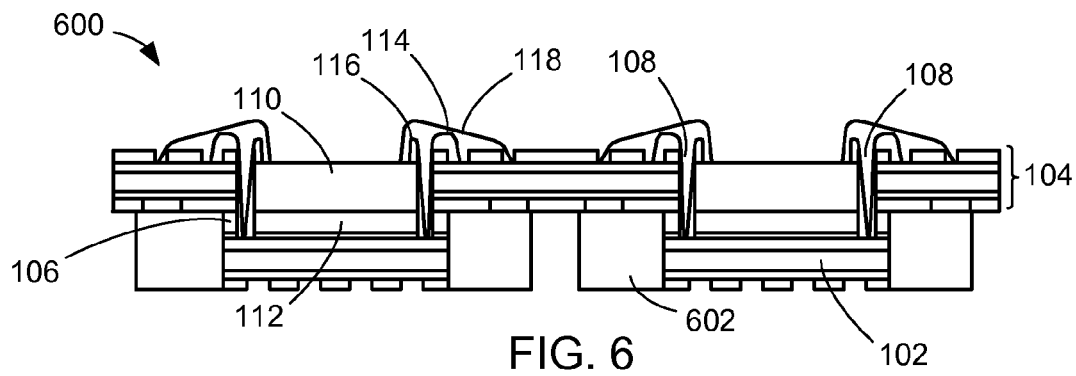
FIG. 6 is a cross-sectional view similar to FIG. 1 of an unfinished semiconductor package of the first embodiment of the present invention after an alternative fourth intermediate stage of the process.

Referring now to FIG. 6, therein is shown a cross-sectional view similar to FIG. 1 of an unfinished semiconductor package 600 of the first embodiment of the present invention after an alternative fourth intermediate stage of the process.

Instead of using the protection layer 202 in FIG. 5 as the support layer for the wire bonding process, the process uses a positively biased heat block 602 of mold chase as the support layer for the wire bonding process.

The substrate bonding wire 114 still connects the first substrate 102 to the second substrate 104. The first type bonding wire 116 connects the semiconductor die 110 to the first substrate 102. The second type bonding wire 118 connects the semiconductor die 110 to the second substrate 104.

Figure 7:
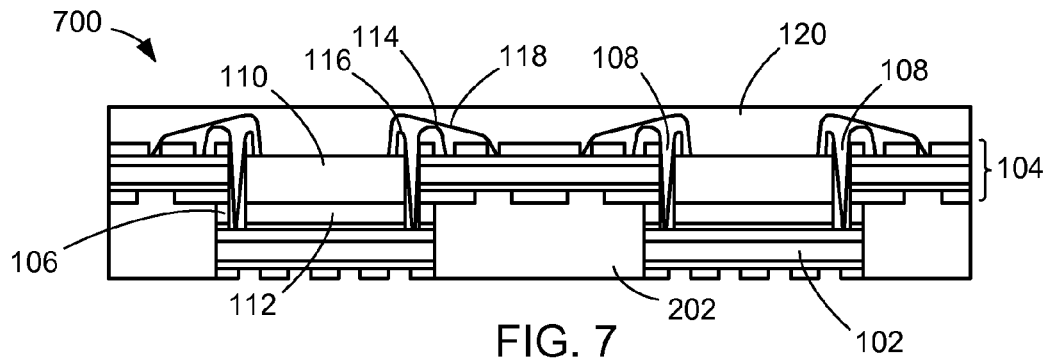
FIG. 7 is a cross-sectional view similar to FIG. 1 of an unfinished semiconductor package of the first embodiment of the present invention after a fifth intermediate stage of the process.

Referring now to FIG. 7, therein is shown a cross-sectional view similar to FIG. 1 of an unfinished semiconductor package 700 of the first embodiment of the present invention after a fifth intermediate stage of the process.

The semiconductor die 110, the die paste 112, the cavity 108, the second substrate 104, the substrate bonding wire 114, the first type bonding wire 116, and the second type bonding wire 118 are encapsulated by the mold 120.

Figure 8:
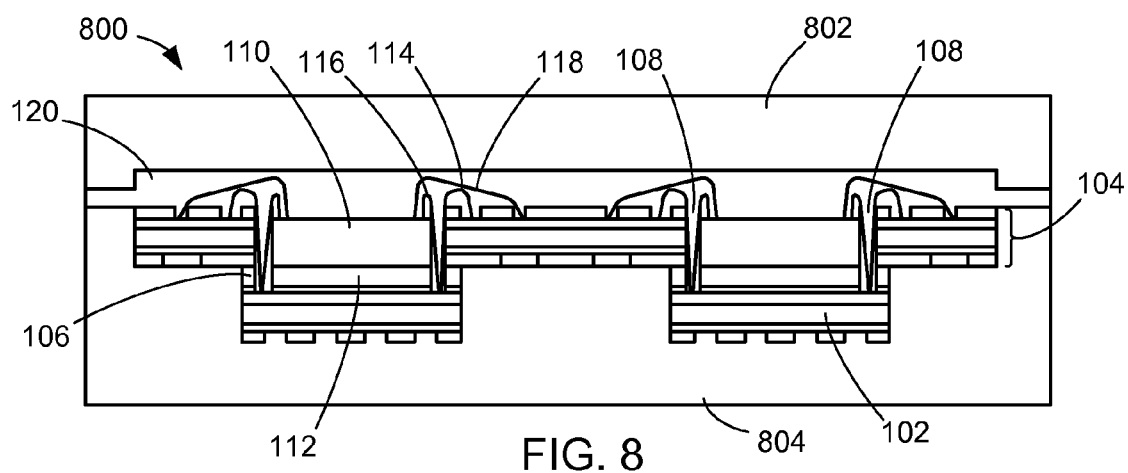
FIG. 8 is a cross-sectional view similar to FIG. 1 of an unfinished semiconductor package of the first embodiment of the present invention after an alternative fifth intermediate stage of the process.

Referring now to FIG. 8, therein is shown a cross-sectional view similar to FIG. 1 of an unfinished semiconductor package 800 of the first embodiment of the present invention after an alternative fifth intermediate stage of the process.

The semiconductor die 110, the die paste 112, the cavity 108, the second substrate 104, the substrate bonding wire 114, the first type bonding wire 116, and the second type bonding wire 118 are encapsulated by the mold 120.

The encapsulation process is done using an upper mold chase 802 and a positively biased lower mold chase 804.

Figure 9:
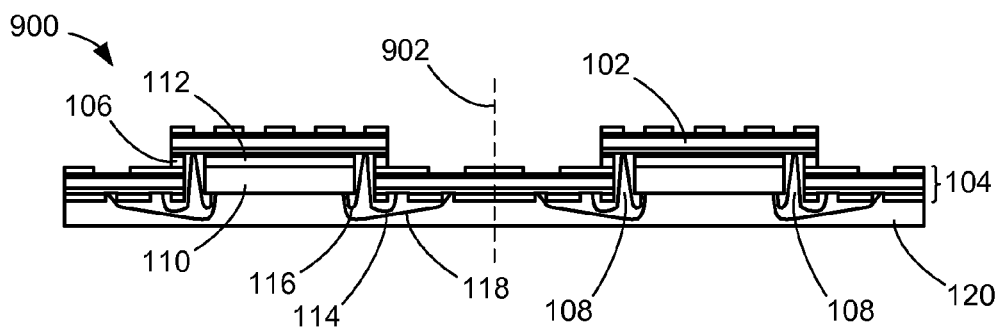
FIG. 9 is a cross-sectional view similar to FIG. 1 of an unfinished semiconductor package of the first embodiment of the present invention after a sixth intermediate stage of the process.

Referring now to FIG. 9, therein is shown a cross-sectional view similar to FIG. 1 of an unfinished semiconductor package 900 of the first embodiment of the present invention after a sixth intermediate stage of the process. The view of FIG. 9 is inverted from the view of FIG. 7.

The protection layer 202 in FIG. 7 is removed. The unfinished semiconductor package 900 is then cut along a dicing line 902, thus forming the semiconductor package 100.

Figure 10:
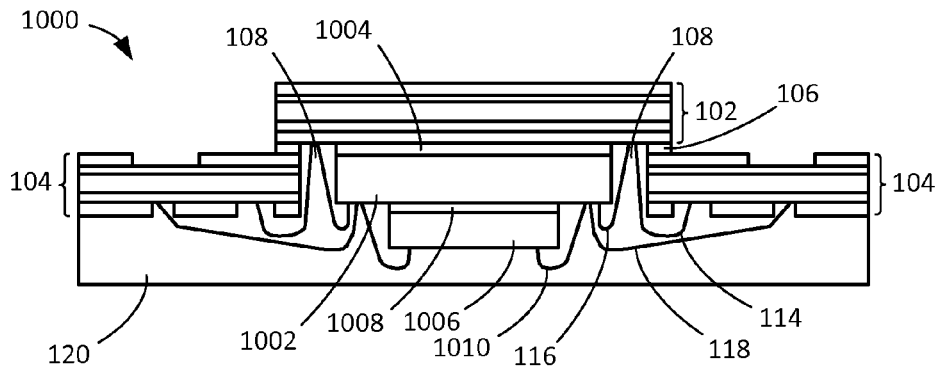
FIG. 10 is a cross-sectional view similar to FIG. 1 of a semiconductor package of a second embodiment of the present invention after a stage of singulation.

Referring now to FIG. 10, therein is shown a cross-sectional view similar to FIG. 1 of a semiconductor package of a second embodiment of the present invention after a stage of singulation.

A finished semiconductor package 1000 is shown. The finished semiconductor package 1000 has the first substrate 102 and the second substrate 104. The first substrate 102 is attached to the second substrate 104 through the substrate adhesive 106. The second substrate 104 has the cavity 108. The cavity 108 is coplanar with the second substrate 104.

A semiconductor chip unit is placed in the cavity 108 and is attached to the first substrate 102. The semiconductor chip unit includes a first semiconductor die 1002 attached to the first substrate 102 through a first die paste 1004. The semiconductor chip unit also includes a second semiconductor die 1006 attached to the first semiconductor die 1002 through a second die paste 1008.

The substrate bonding wire 114 connects the first substrate 102 to the second substrate 104. The first type bonding wire 116 connects the first semiconductor die 1002 to the first substrate 102. The second type bonding wire 118 connects the first semiconductor die 1002 to the second substrate 104. A die bonding wire 1010 connects the first semiconductor die 1002 to the second semiconductor die 1006.

The first semiconductor die 1002, the first die paste 1004, the second semiconductor die 1006, the second die paste 1008, the cavity 108, the second substrate 104, the substrate bonding wire 114, the first type bonding wire 116, the second type bonding wire 118, and the die bonding wire 1010 are encapsulated by the mold 120.

In the current embodiment of the present invention, the first substrate 102, the semiconductor chip unit having the first semiconductor die 1002 and the second semiconductor die 1006, and the second substrate 104 are not on top of one another. However, due to the existence of the cavity 108, the semiconductor chip unit having the first semiconductor die 1002 and the second semiconductor die 1006 and the second substrate 104 are horizontal to each other, instead of vertical to each other. It has been discovered that this configuration reduces the thickness of the finished semiconductor package 1000, resulting in increased packaging density.

Figure 11:
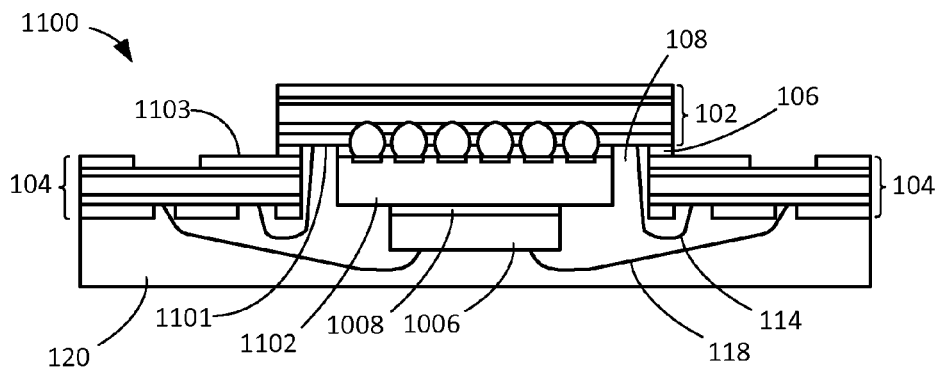
FIG. 11 is a cross-sectional view similar to FIG. 1 of a semiconductor package of a third embodiment of the present invention after a stage of singulation.

Referring now to FIG. 11, therein is shown a cross-sectional view similar to FIG. 1 of a semiconductor package of a third embodiment of the present invention after a stage of singulation.

A finished semiconductor package 1100 is shown. The finished semiconductor package 1100 has the first substrate 102 and the second substrate 104. The first substrate 102 can include a bottom side 1101 and the second substrate 104 can include a top side 1103. The bottom side 1101 of the first substrate 102 directly faces the top side 1103 of the second substrate 104. The bottom side 1101 of the first substrate 102 is attached on the top side 1103 of the second substrate 104 through the substrate adhesive 106, which is directly attached to both the bottom side 1101 of the first substrate 102 and the top side 1103 of the second substrate 104. A side of the second substrate 104 is facing the first substrate 102. A portion of the side of the second substrate 104 is exposed from the first substrate 102 to a peripheral edge of the second substrate 104. The second substrate 104 has the cavity 108. The cavity 108 is coplanar with the second substrate 104.

A semiconductor chip unit is placed in the cavity 108 and is attached to the first substrate 102. The semiconductor chip unit includes a flip chip die 1102 attached to the first substrate 102. The semiconductor chip unit also includes the second semiconductor die 1006 attached to the flip chip die 1102 through the second die paste 1008.

The substrate bonding wire 114 connects the first substrate 102 to the second substrate 104. The second type bonding wire 118 connects the second semiconductor die 1006 to the second substrate 104.

The flip chip die 1102, the second semiconductor die 1006, the second die paste 1008, the cavity 108, the second substrate 104, the substrate bonding wire 114, and the second type bonding wire 118 are encapsulated by the mold 120. The mold 120 is in direct contact with the second substrate 104 only on a lower side of the second substrate and the substrate sidewall of the second substrate.

In the current embodiment of the present invention, the first substrate 102, the semiconductor chip unit having the flip chip die 1102 and the second semiconductor die 1006, and the second substrate 104 are not on top of one another. However, due to the existence of the cavity 108, the semiconductor chip unit having the flip chip die 1102 and the second semiconductor die 1006 and the second substrate 104 are horizontal to each other, instead of vertical to each other. It has been discovered that this configuration reduces the thickness of the finished semiconductor package 1100, resulting in increased packaging density.

Figure 12:
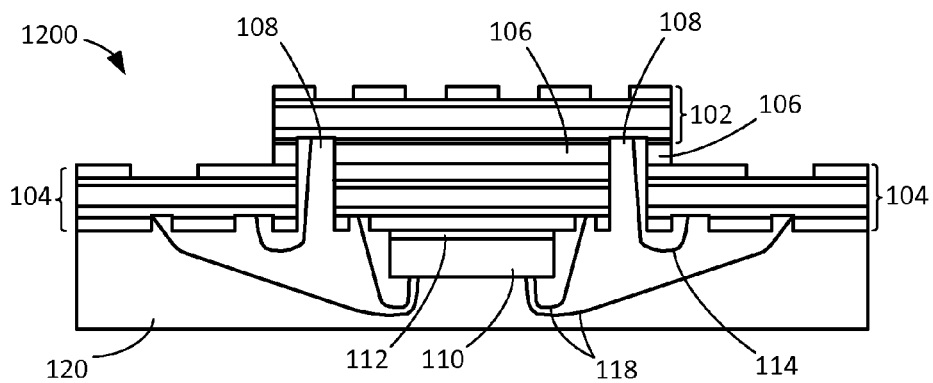
FIG. 12 is a cross-sectional view similar to FIG. 1 of a semiconductor package of a fourth embodiment of the present invention after a stage of singulation.

Referring now to FIG. 12, therein is shown a cross-sectional view similar to FIG. 1 of a semiconductor package of a fourth embodiment of the present invention after a stage of singulation.

A finished semiconductor package 1200 is shown. The finished semiconductor package 1200 has the first substrate 102 and the second substrate 104. The first substrate 102 is attached to the second substrate 104 through the substrate adhesive 106. The second substrate 104 has the cavity 108. The cavity 108 is coplanar with the second substrate 104.

The semiconductor die 110 is attached to the second substrate 104 through the die paste 112. The substrate bonding wire 114 connects the first substrate 102 to the second substrate 104. The second type bonding wire 118 connects the semiconductor die 110 to the second substrate 104.

The semiconductor die 110, the die paste 112, the cavity 108, the second substrate 104, the substrate bonding wire 114, and the second type bonding wire 118 are encapsulated by the mold 120.

In the current embodiment of the present invention, the first substrate 102 and the second substrate 104 are in direct contact with each other through the substrate adhesive 106. There is no other device sandwiched in between. Other semiconductor devices could be placed in the cavity 108 and on the first substrate 102, although it is not shown in this embodiment of the present invention. It has been discovered that this configuration reduces the thickness of the finished semiconductor package 1200, resulting in increased packaging density.

Figure 13:
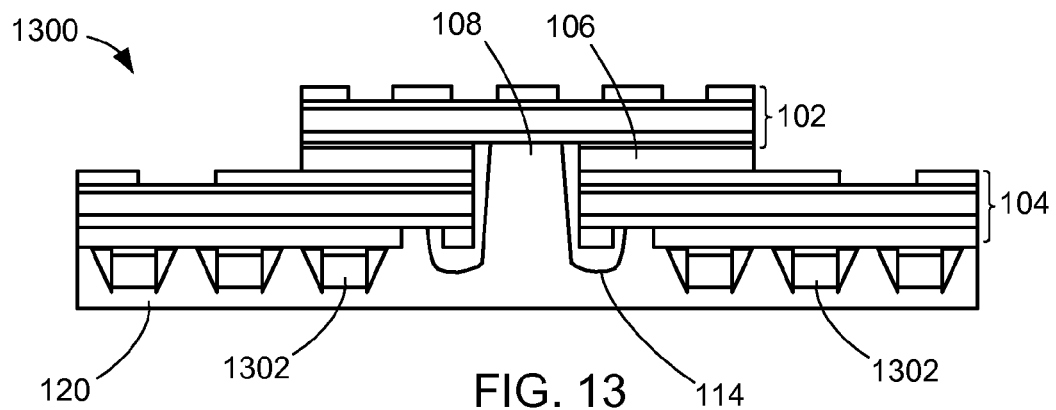
FIG. 13 is a cross-sectional view similar to FIG. 1 of a semiconductor package of a fifth embodiment of the present invention after a stage of singulation.

Referring now to FIG. 13, therein is shown a cross-sectional view similar to FIG. 1 of a semiconductor package of a fifth embodiment of the present invention after a stage of singulation.

A finished semiconductor package 1300 is shown. The finished semiconductor package 1300 has the first substrate 102 and the second substrate 104. The first substrate 102 is attached to the second substrate 104 through the substrate adhesive 106. The second substrate 104 has the cavity 108. The cavity 108 is coplanar with the second substrate 104.

The substrate bonding wire 114 connects the first substrate 102 to the second substrate 104. A discrete passive device 1302 is attached to the second substrate 104.

The discrete passive device 1302, the cavity 108, the second substrate 104, and the substrate bonding wire 114 are encapsulated by the mold 120.

In the current embodiment of the present invention, the first substrate 102 and the second substrate 104 are in direct contact with each other through the substrate adhesive 106. There is no other device sandwiched in between. Other semiconductor devices could be placed in the cavity 108 and on the first substrate 102, although it is not shown in this embodiment of the present invention. It has been discovered that this configuration reduces the thickness of the finished semiconductor package 1300, resulting in increased packaging density.

It has also been discovered that the placement of the discrete passive device 1302 on the second substrate 104 saves space later on in the process when additional substrate interposer is used in 3D packages, resulting in enhanced packaging density.

Figure 14:
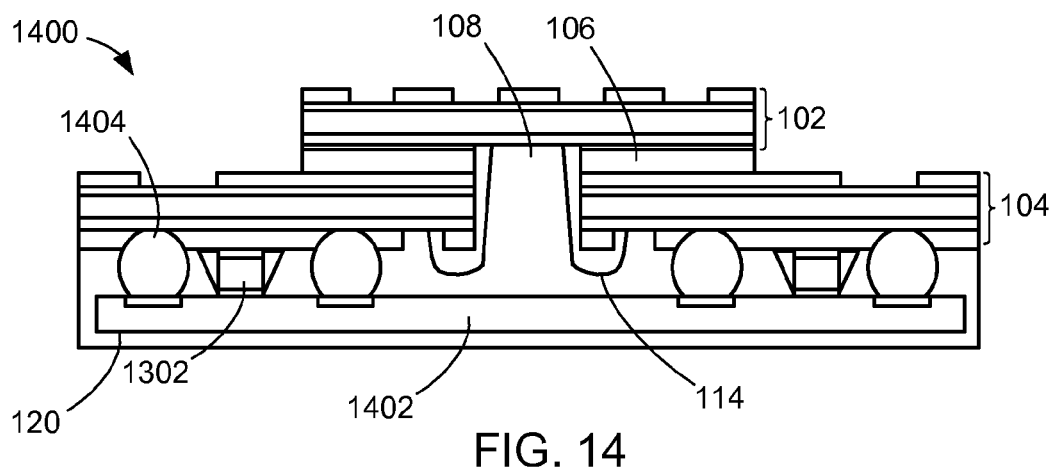
FIG. 14 is a cross-sectional view similar to FIG. 1 of a semiconductor package of a sixth embodiment of the present invention after a stage of singulation.

Referring now to FIG. 14, therein is shown a cross-sectional view similar to FIG. 1 of a semiconductor package of a sixth embodiment of the present invention after a stage of singulation.

A finished semiconductor package 1400 is shown. The finished semiconductor package 1400 has the first substrate 102 and the second substrate 104. The first substrate 102 is attached to the second substrate 104 through the substrate adhesive 106. The second substrate 104 has the cavity 108. The cavity 108 is coplanar with the second substrate 104.

The substrate bonding wire 114 connects the first substrate 102 to the second substrate 104. The discrete passive device 1302 is attached to the second substrate 104. A second type flip chip die 1402 is attached to the second substrate 104 a through on-chip solder ball 1404.

The discrete passive device 1302, the cavity 108, the second substrate 104, the substrate bonding wire 114, the second type flip chip die 1402, and the on-chip solder ball 1404 are encapsulated by the mold 120.

In the current embodiment of the present invention, the first substrate 102 and the second substrate 104 are in direct contact with each other through the substrate adhesive 106. There is no other device sandwiched in between. Other semiconductor devices could be placed in the cavity 108 and on the first substrate 102, although it is not shown in this embodiment of the present invention. It has been discovered that this configuration reduces the thickness of the finished semiconductor package 1400, resulting in increased packaging density.

It has also been discovered that the placement of the discrete passive device 1302 on the second substrate 104 saves space later on in the process when additional substrate interposer is used in 3D packages, resulting in enhanced packaging density.

Figure 15:
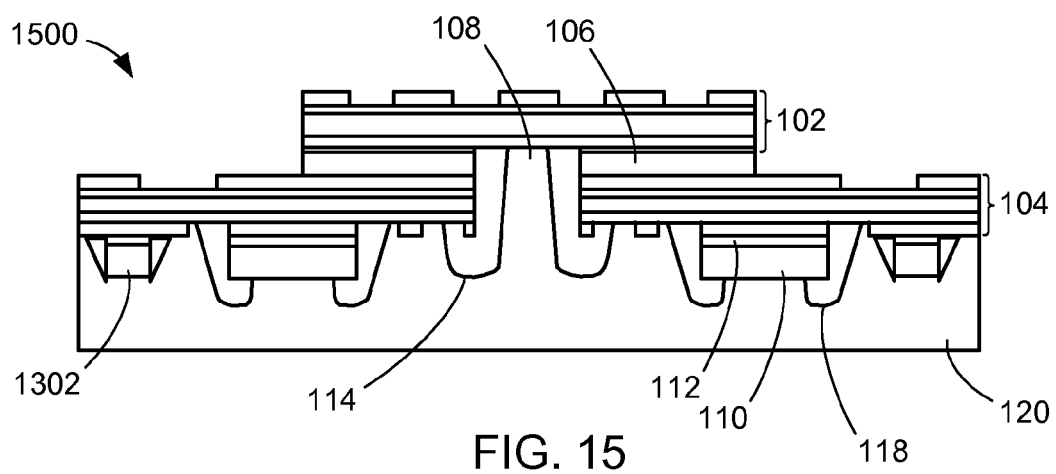
FIG. 15 is a cross-sectional view similar to FIG. 1 of a semiconductor package of a seventh embodiment of the present invention after a stage of singulation.

Referring now to FIG. 15, therein is shown a cross-sectional view similar to FIG. 1 of a semiconductor package of a seventh embodiment of the present invention after a stage of singulation.

A finished semiconductor package 1500 is shown. The finished semiconductor package 1500 has the first substrate 102 and the second substrate 104. The first substrate 102 is attached to the second substrate 104 through the substrate adhesive 106. The second substrate 104 has the cavity 108. The cavity 108 is coplanar with the second substrate 104.

The substrate bonding wire 114 connects the first substrate 102 to the second substrate 104. The discrete passive device 1302 is attached to the second substrate 104. The semiconductor die 110 is attached to the second substrate 104 through the die paste 112. The second type bonding wire 118 connects the semiconductor die 110 to the second substrate 104.

The discrete passive device 1302, the cavity 108, the second substrate 104, the semiconductor die 110, the die paste 112, the substrate bonding wire 114, and the second type bonding wire 118 are encapsulated by the mold 120.

In the current embodiment of the present invention, the first substrate 102 and the second substrate 104 are in direct contact with each other through the substrate adhesive 106. There is no other device sandwiched in between. Other semiconductor devices could be placed in the cavity 108 and on the first substrate 102, although it is not shown in this embodiment of the present invention. It has been discovered that this configuration reduces the thickness of the finished semiconductor package 1500, resulting in increased packaging density.

It has also been discovered that the placement of the discrete passive device 1302 on the second substrate 104 saves space later on in the process when additional substrate interposer is used in 3D packages, resulting in enhanced packaging density.

Figure 16:
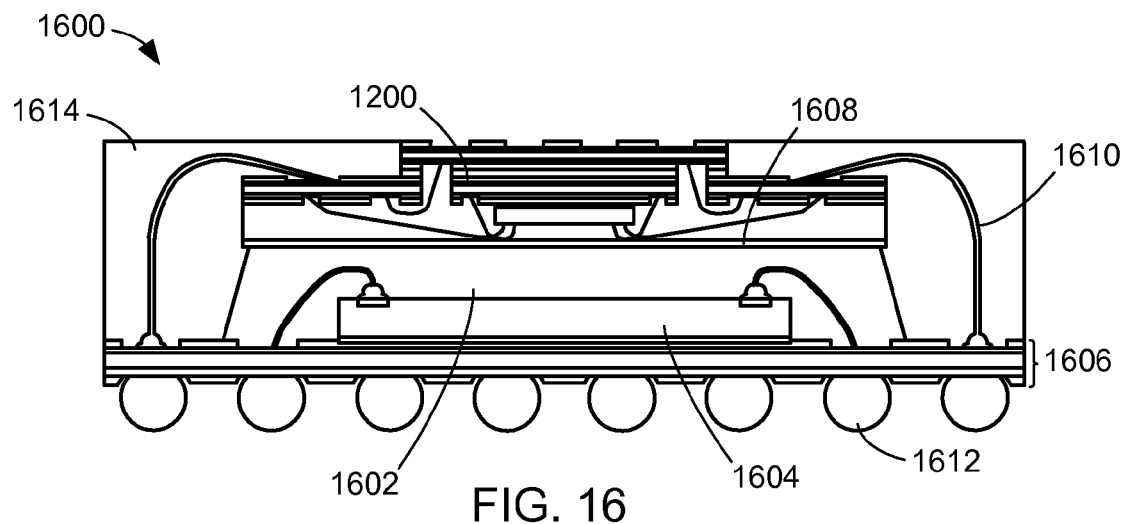
FIG. 16 is a cross-sectional view similar to FIG. 1 of a semiconductor package of an eighth embodiment of the present invention after a stage of singulation.

Referring now to FIG. 16, therein is shown a cross-sectional view similar to FIG. 1 of a semiconductor package of an eighth embodiment of the present invention after a stage of singulation.

A finished semiconductor package 1600 is shown. The finished semiconductor package 1600 is a Fan-in Package-on-Package package. The finished semiconductor package 1600 has a bottom package 1602 and the finished semiconductor package 1200 of the present invention as the top package. The finished semiconductor package 1200 serves as an internal stacking module in the finished semiconductor package 1600.

The bottom package 1602 has a bottom semiconductor die 1604 and a bottom interposer 1606. The finished semiconductor package 1200 is attached to the bottom package 1602 through an internal stacking module paste 1608. The finished semiconductor package 1200 is connected to the bottom interposer 1606 of the bottom package 1602 through an internal stacking module bonding wire 1610. A solder ball 1612 is attached to the bottom interposer 1606 of the bottom package 1602.

The bottom package 1602, the finished semiconductor package 1200, the bottom semiconductor die 1604, the bottom interposer 1606, the internal stacking module paste 1608, and the internal stacking module bonding wire 1610 are encapsulated in a package mold 1614.

In the current embodiment of the present invention, it has been discovered that since the thickness of the finished semiconductor package 1200 could be reduced by its configuration, the total thickness of the Fan-in Package-on-Package package is reduced, resulting in increased packaging density.

It has also been discovered that the current embodiment of present invention allows the use of a flat top mold chase during the molding process. Conventional Fi-PoP packages uses customized cavity mold chase that has protrusions. A flat top mold chase used for the current Fi-PoP packages is cheaper than the conventional mold chase, resulting in reduced cost of manufacture.

Figure 17:
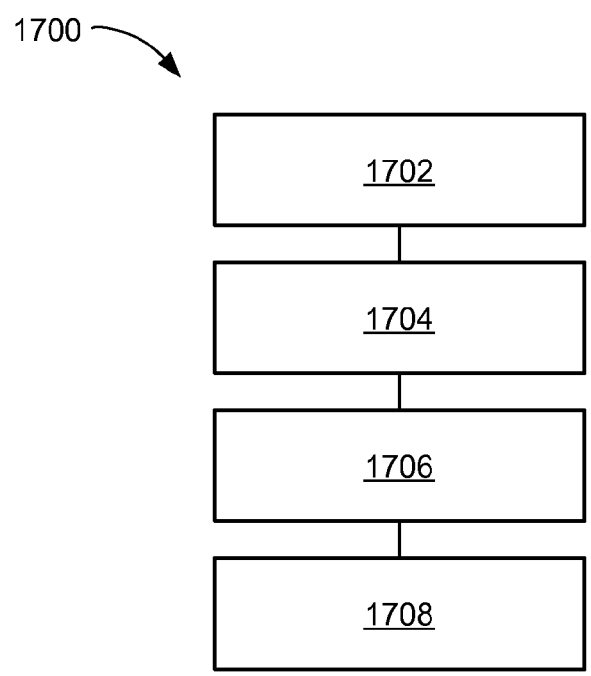
FIG. 17 is a flow chart of a method of manufacturing a semiconductor package system in an embodiment of the present invention.

Referring now to FIG. 17, therein is shown a flow chart of a method 1700 of manufacturing the semiconductor package 100 in an embodiment of the present invention. The method 1700 includes providing a first substrate in a block 1702; providing a second substrate having a cavity, the second substrate being attached to the first substrate in a block 1704; connecting the first substrate to the second substrate using an interconnect, the interconnect being in the cavity in a block 1706; and attaching a semiconductor device to the first substrate or the second substrate in a block 1708.

It has been discovered that the present invention reduces semiconductor package thickness by using a substrate with a cavity; reduces the total package thickness of Fan-in Package-on-Package package due to the reduced thickness of the internal stacking module having the substrate with the cavity used in the Fan-in Package-on-Package package; allows the usage of a flat top mold chase, which is cheaper than conventional mold chase with protrusion, resulting in reduced cost of manufacture; and saves space by placing discrete passive devices on secondary substrate, resulting in denser packaging.

Yet another important aspect of the present invention is that it valuably supports and services the historical trend of reducing manufacturing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, reducing complexity, and reducing cost of integrated circuit system. The resulting processes and configurations are straightforward, cost-effective, uncomplicated, highly versatile and effective, can be surprisingly and unobviously implemented by adapting known technologies, and are thus readily suited for efficiently and economically manufacturing integrated circuit package system fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing a semiconductor package system comprising:
    providing a first substrate having a bottom side;
    attaching a substrate adhesive directly to the bottom side of the first substrate;
    mounting a second substrate having a top side on the bottom side of the first substrate, the top side directly facing the bottom side, the substrate adhesive directly attached between the bottom side and the top side, the second substrate having a cavity;
    attaching a substrate bonding wire directly to the first substrate and the second substrate, a portion of the substrate bonding wire in the cavity;
    attaching a semiconductor device directly to the bottom side of the first substrate, the semiconductor device within the cavity of the second substrate and a device sidewall of the semiconductor device facing a substrate sidewall of the second substrate;
    encapsulating in a mold the semiconductor device and the second substrate, the mold in the cavity, the mold in direct contact with the second substrate only on a lower side of the second substrate and the substrate sidewall the second substrate; and
    cutting the mold and the second substrate for forming a peripheral edge of the mold coplanar with a peripheral edge of the second substrate, the second substrate having the top side exposed to the peripheral edge of the second substrate.

2. The method as claimed in claim 1 wherein connecting the semiconductor device includes attaching a semiconductor die to the first substrate, the semiconductor die being in the cavity.

3. The method as claimed in claim 1 wherein connecting the semiconductor device includes attaching a first semiconductor die to the first substrate, the first semiconductor die being in the cavity, and attaching a second semiconductor die to the first semiconductor die.

4. The method as claimed in claim 1 wherein connecting the semiconductor device includes attaching a flip chip die to the first substrate, the flip chip die being in the cavity, and attaching a second semiconductor die to the flip chip die.

5. The method as claimed in claim 1 wherein connecting the semiconductor device includes attaching a discrete passive device to the second substrate.

6. A method of manufacturing a semiconductor package system comprising:
    providing a first substrate having a bottom side;
    attaching a substrate adhesive directly to the bottom side of the first substrate;
    mounting a second substrate having a top side to the bottom side of the first substrate with a substrate adhesive on the first substrate and the second substrate, the top side directly facing the bottom side, the substrate adhesive directly attached between the bottom side and the top side, the second substrate having a cavity;

attaching a substrate bonding wire directly to the first substrate and to the second substrate, a portion of the substrate bonding wire in the cavity;

attaching a semiconductor device directly to the bottom side of the first substrate, the semiconductor device within the cavity of the second substrate and a device sidewall of the semiconductor device facing a substrate sidewall of the second substrate;

encapsulating in a mold the semiconductor device, the substrate bonding wire, and the second substrate, the mold in the cavity, the mold in direct contact with the second substrate only on a lower side of the second substrate and the substrate sidewall of the second substrate; and cutting the mold and the second substrate for forming a peripheral edge of the mold coplanar with a peripheral edge of the second substrate, the second substrate having the top side exposed to the peripheral edge of the second substrate.

7. The method as claimed in claim 6 wherein connecting the semiconductor device includes attaching a discrete passive device to the second substrate and attaching a second type flip chip die to the second substrate through an on-chip solder ball.

8. The method as claimed in claim 6 wherein attaching the substrate bonding wire includes using a protection layer attached to the second substrate as a support layer during an interconnecting process.

9. The method as claimed in claim 6 wherein attaching the substrate bonding wire includes using a positively biased heat block attached to the second substrate as a support layer during an interconnecting process.

10. The method as claimed in claim 1 wherein encapsulating the semiconductor device, the substrate bonding wire, the second substrate, and the cavity in a mold includes using an upper mold chase and a positively biased lower mold chase.

11. A semiconductor package system comprising:
a first substrate having a bottom side;
a substrate adhesive directly attached to the bottom side of the first substrate;
a second substrate having a top side mounted to the bottom side of the first substrate, the top side directly facing the bottom side, the substrate adhesive directly attached between the bottom side and the top side, the second substrate having a cavity, the second substrate having a portion of the top side, exposed to a peripheral edge of the second substrate;
a substrate bonding wire attached directly to the first substrate and the second substrate, a portion of the substrate bonding wire in the cavity;
a semiconductor device attached to the bottom side of the first substrate, the semiconductor device within the cavity of the second substrate and a device sidewall of the semiconductor device facing a substrate sidewall of the second substrate; and
a mold encapsulating the semiconductor device and the second substrate, the mold in the cavity, the mold having a peripheral edge coplanar with the peripheral edge of the second substrate, the mold in direct contact with the second substrate only on a lower side of the second substrate and the substrate sidewall of the second substrate.

12. The system as claimed in claim 11 wherein the semiconductor device includes a semiconductor die attached to the first substrate, the semiconductor die being in the cavity.

13. The system as claimed in claim 11 wherein the semiconductor device includes a first semiconductor die attached to the first substrate, the first semiconductor die being in the cavity, and a second semiconductor die attached to the first semiconductor die.

14. The system as claimed in claim 11 wherein the semiconductor device includes a flip chip die attached to the first substrate, the flip chip die being in the cavity, and a second semiconductor die attached to the flip chip die.

15. The system as claimed in claim 11 wherein the semiconductor device includes a semiconductor die attached to the second substrate, the semiconductor die being near the cavity but not in the cavity.

16. The system as claimed in claim 11 wherein:
the mold encapsulates the substrate bonding wire.

17. The system as claimed in claim 16 wherein the semiconductor device includes a discrete passive device attached to the second substrate.

18. The system as claimed in claim 16 wherein the semiconductor device includes a discrete passive device attached to the second substrate and a second type flip chip die attached to the second substrate through an on-chip solder ball.

19. The system as claimed in claim 16 wherein the semiconductor device includes a discrete passive device attached to the second substrate and a semiconductor die attached to the second substrate.

20. The system as claimed in claim 16 further comprising:
a bottom package of a Fan-in Package-on-Package package, the bottom package having a bottom semiconductor die and a bottom interposer;
a semiconductor package attached to the bottom package as an internal stacking module;
an internal stacking module bonding wire connecting the semiconductor package system to the bottom interposer of the bottom package;
a package mold encapsulating the semiconductor package system, the bottom semiconductor die, and the internal stacking module bonding wire; and
a solder ball attached to the bottom interposer of the bottom package.

* * * * *